United States Patent
Dissertori et al.

(10) Patent No.: US 11,703,604 B2
(45) Date of Patent: Jul. 18, 2023

(54) DETECTION DEVICE AND METHOD FOR DETECTING SENSOR SIGNALS IN A GRID OF SENSOR ELEMENTS

(71) Applicant: ETH Zurich, Zurich (CH)

(72) Inventors: Günther Dissertori, Steinmaur (CH); Max Ahnen, Zürich (CH); Jannis Fischer, Zürich (CH); Werner Lustermann, Cessy (FR); Ulf Röser, Zürich (CH)

(73) Assignee: ETH ZURICH, Zurich (CH)

( * ) Notice: Subject to any disclaimer, the term of this patent is extended or adjusted under 35 U.S.C. 154(b) by 274 days.

(21) Appl. No.: 17/257,056

(22) PCT Filed: Jul. 2, 2019

(86) PCT No.: PCT/EP2019/067713
§ 371 (c)(1),
(2) Date: Dec. 30, 2020

(87) PCT Pub. No.: WO2020/007850
PCT Pub. Date: Jan. 9, 2020

(65) Prior Publication Data
US 2021/0141102 A1    May 13, 2021

(30) Foreign Application Priority Data

Jul. 4, 2018 (EP) .................................. 18181629

(51) Int. Cl.
*H01L 27/146* (2006.01)
*G01T 1/208* (2006.01)
*G01T 1/24* (2006.01)

(52) U.S. Cl.
CPC .............. *G01T 1/208* (2013.01); *G01T 1/248* (2013.01); *H01L 27/14603* (2013.01); *H01L 27/14609* (2013.01); *H01L 27/14641* (2013.01)

(58) Field of Classification Search
CPC ......... H01L 27/14603; H01L 27/14609; H01L 27/14641
See application file for complete search history.

(56) References Cited

U.S. PATENT DOCUMENTS 9,405,023 B2    8/2016  Guo et al.
2007/0013652 A1*  1/2007  Kim ...................... A61B 3/113
                                                    345/156

(Continued)

FOREIGN PATENT DOCUMENTS

EP      0 287 197      10/1988
WO      2014/173644    10/2014

*Primary Examiner* — Thanh Luu
(74) *Attorney, Agent, or Firm* — Rankin, Hill & Clark LLP

(57) ABSTRACT

A detection device for detecting at least the occurrence and location of occurrence of sensor element signals that are generated by sensor elements, includes an array of detector element circuits each generating a element row output and at least one element column output. The detection device determines, for each row of detector element circuits, at least a first row summation signal corresponding to a sum of the element row outputs of the detector element circuits of this row, and a row address signal indicating that the first row summation signal crosses a threshold. The detection device also determines, for each column of detector element circuits, at least a first column summation signal corresponding to a sum of the element column outputs of the detector element circuits of this column, and a column address signal indicating that the first column summation signal crosses a threshold.

19 Claims, 2 Drawing Sheets

(56) References Cited

U.S. PATENT DOCUMENTS

2012/0305984 A1    12/2012   Campi, Jr. et al.
2016/0041277 A1     2/2016   Roknsharifi \* cited by examiner

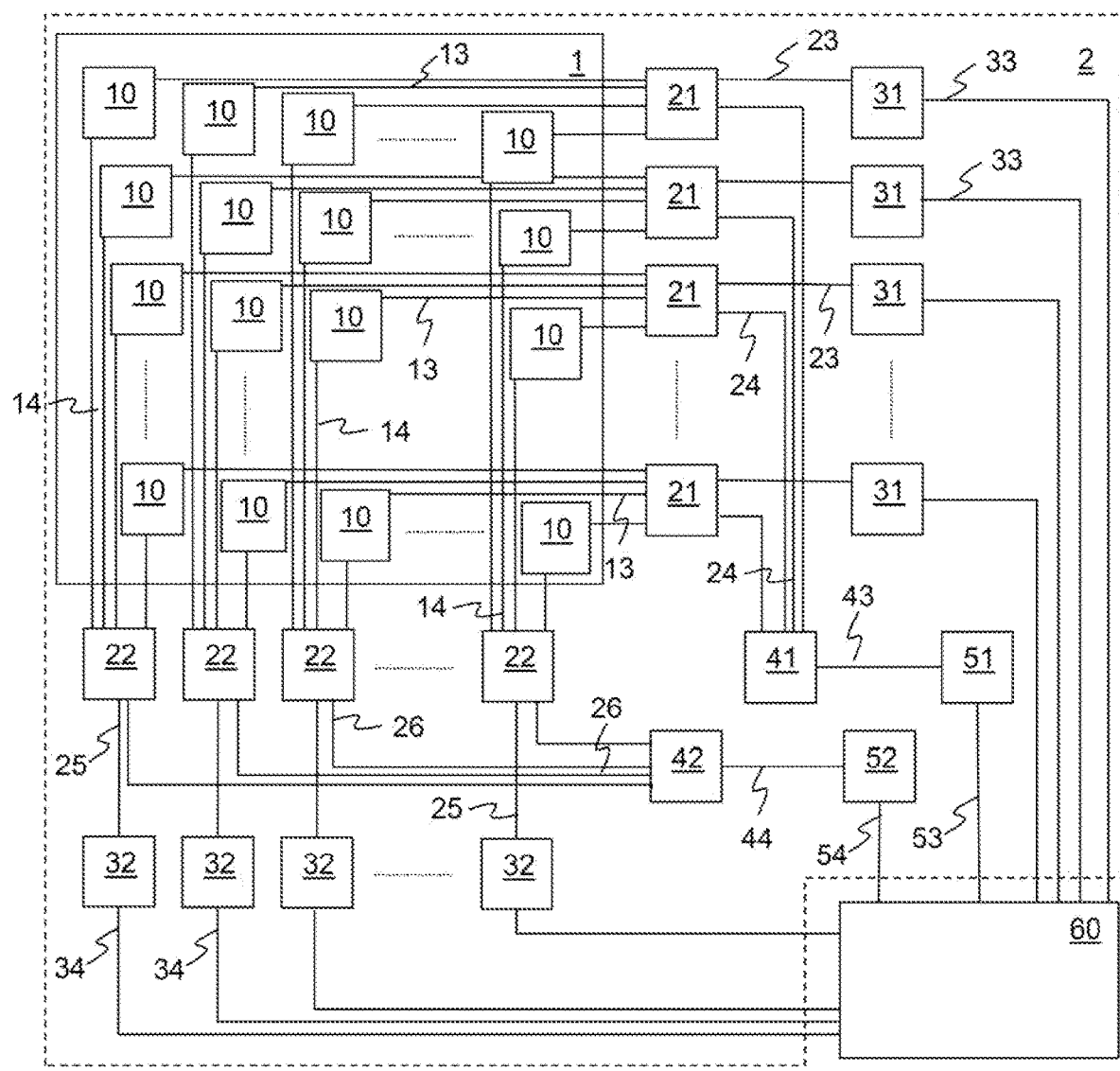
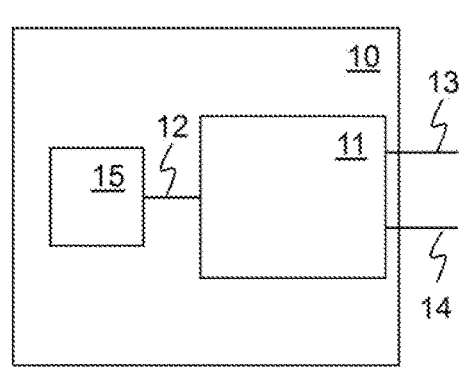
Fig. 2
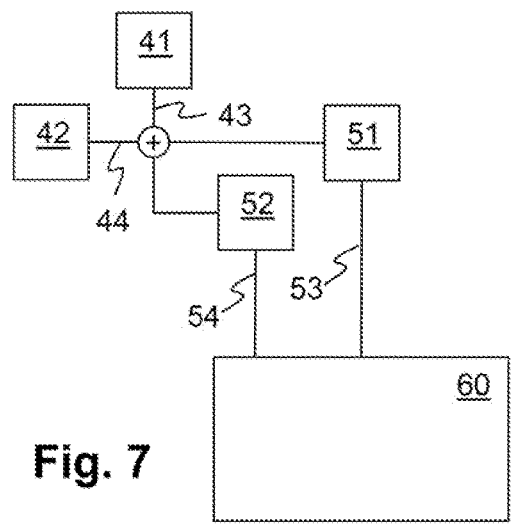
Fig. 7
Fig. 1

DETECTION DEVICE AND METHOD FOR DETECTING SENSOR SIGNALS IN A GRID OF SENSOR ELEMENTS

BACKGROUND OF THE INVENTION

Field of the Invention

The invention relates to the field of electronic sensing devices, in particular having a grid of sensors. It relates to a detection device and method for detecting sensor signals in a grid of sensor elements.

Description of Related Art

Typical pixelated radiation detectors, e.g., for Positron Emission Tomography (PET), Gamma-Camera, also called a scintillation camera or Anger camera use a plurality of detection elements, such as scintillators and fast photo sensors. Spatial resolution of the detector depends on the size of the sensor element and the number of individual sensor elements. As these increase, sensor readout usually are multiplexed. Sensor elements typically are current sources with a significant capacitance. Connecting subsets of sensor element signals connects these capacitances in parallel, leading to signal degradation, in particular a slowing down of the pulse edges, and resulting in a tradeoff between grid size and performance. Current solutions require digitisation of signal amplitudes in order to determine which sensor elements are the source of a signal, which leads to a generally linearly increasing number of channels that needs to be digitised.

U.S. Pat. No. 9,405,023 B2 discloses an interface to an array of photodetectors in the form of Silicon photomultipliers (SiPM), each having an analog signal output. Three weighted sums are determined, applying different weights. The first weighted sum represents an energy level of a hit, the second represents an X location, and the third represents a Y location of the hit. In these summing of the signals, their analog values remain relevant, and the accuracy of the analog processing directly affects the accuracy of the X and Y location.

US 2016/041277 A1, in a similar manner, discloses computing a sum of position-weighted currents whose ratio indicates a location of a radiation signal at a detector array.

EP 0 287 197 A1 discloses buffer circuits in a radiation image detection system. The buffer circuits include FETs whose gate and drain are connected to the output of a radiation sensor and to the input of an amplifier, respectively. Furthermore, each buffer circuit implements a current-mirror circuit having two output terminals, one for a row-side amplifier and the other one for a column-side amplifier.

WO 2014/173644 A1 discloses a detection circuit which first generates a digital signal for each image pixel, and then processes these via analog signals.

US 2012/305984 A1 discloses an electrostatic discharge protection circuit with a dual collector transistor.

SUMMARY OF THE INVENTION

It is therefore an object of the invention to create a detection device and method for detecting sensor signals in a grid of sensor elements of the type mentioned initially, which overcomes the disadvantages mentioned above.

According to a first aspect of the invention, a detection device as follows is provided.

The detection device is for detecting at least the occurrence and the location of occurrence of sensor element signals that are generated by sensor elements. The detection device includes a plurality of detector element circuits, each detector element circuit being configured to process an associated sensor element signal and to generate detector element signals, corresponding to the associated sensor element signal.

For each detector element circuit, the detector element signals include at least one element row output and at least one element column output, wherein values of these two outputs correspond to each other. In particular, they can be equal to one another. The detector element circuits are grouped into row subsets and column subsets,
- wherein the union of all the row subsets is the set of detector element circuits, and each detector element circuit is member of exactly one of the row subsets (in other words: the intersection of every pairwise combination of row subsets is the empty set),
- wherein the union of all the column subsets is the set of detector element circuits, and each detector element circuit is member of exactly one of the column subsets (in other words: the intersection of every pairwise combination of column subsets is the empty set),
- wherein every pairwise intersection of one of the row subsets with one of the column subset contains exactly one detector element circuit, The detection device is configured to determine,
- for each row subset of detector element circuits, at least a first row summation signal corresponding to a sum of the element row outputs of the detector element circuits of this row subset, and a row address signal indicating, by being in an active state, that the first row summation signal crosses a threshold,
- for each column subset of detector element circuits, at least a first column summation signal corresponding to a sum of the element column outputs of the detector element circuits of this column subset, and a column address signal indicating, by being in an active state, that the first column summation signal crosses a threshold.

The sensor elements can be arranged in a grid of N rows and M columns of sensor elements.

The association of detector element circuits to sensor elements typically is a one-to-one association.

As a result, if an event occurs that causes the generation of a sensor element signal in exactly one of the sensor elements, and if the amplitude of the sensor element signal causes one of the row summation signals and one of the column summation signals to exceed the respective threshold, then exactly one row address signal and exactly one column address signal will be in an active state and thereby indicate the location of the sensor element and the corresponding event.

In embodiments, when the detector element circuits are connected to sensor elements—the sensor elements being arranged in rows and columns forming a grid—the sensor elements in a particular row are associated, by a one-to-one correspondence, with detector element circuits of a corresponding row subset. Likewise, the sensor elements of a particular column are associated, by a one-to-one correspondence, with a detector element circuits of a corresponding column subset.

Generally, when it is said that one signal corresponds to another one, this means that there is a one-to-one correspondence, that is, a bijective function relating values of the two signals. Often there is a proportional relationship between the two signals, with or without inversion of polarity. The proportionality constant between the two signals can be any real number. In some cases, in particular when two signals are generated by the same circuit, such signals said to correspond to one another are equal to one another.

A signal crossing a threshold can mean that the signal becomes larger than or smaller than the threshold. Depending on which signal the thresholds correspond to, their values may differ. A threshold can be a constant value or can be adapted dynamically, as in a constant fraction discriminator (CFD). More generally, the signal can be processed to perform a transformation and an evaluation of the transformed signal. The evaluation returns information about the signal, which functionally can be the same as providing the information that the signal has crossed a (static or dynamically determined) threshold.

In embodiments, the detection device of claim is configured to determine, for each row subset of detector element circuits, at least a second row summation signal corresponding to the sum of the element row outputs of the detector element circuits of this row subset, and a row total signal corresponding to a sum of the second row summation signals.

This makes it possible to generate the row total signal as a first signal that corresponds to the sum of all sensor element signals, and can be used in further signal processing, e.g., determining an amplitude of an event giving rise to the sensor element signals, or for triggering a timing circuit, etc.

At least one of the two summation signals (row or column) is sufficient for triggering the latching of the address signals.

In order to have one signal earlier than the other, for example the trigger signal earlier than the timing signal, the latter can be delayed by processing or passing it through a delay line, such as a cable.

In embodiments, the detection device of claim is configured to determine, for each column subset of detector element circuits, at least a second column summation signal corresponding to the sum of the element column outputs of the detector element circuits of this column subset, and a column total signal corresponding to a sum of the second column summation signals.

This makes it possible to generate the column total signal as a second signal corresponding to the sum of all sensor element signals, wherein this second signal is generated independently from the first. This allows the second signal to be generated and processed independently from and not affecting the first. This can be advantageous for high speed signal processing, where there can be different requirements with regard to bandwidth and linearity.

In embodiments, the detection device is configured to determine, from the row total signal or from the column total signal or from a sum of the row total signal and column total signal, a timing signal and to determine, from the timing signal, event time data representing a time derived from the timing signal in a deterministic way, for example a time when the timing signal crosses a threshold. Other methods for time detection apply as well.

In embodiments, the detection device is configured to determine, from the row total signal or from the column total signal or from a sum of the row total signal and column total signal, a trigger signal, and to trigger, by the trigger signal, a recording of at least one of the state of row address signals and column address signals, event time data representing a time at which a timing signal crosses a threshold.

According to a second aspect of the invention, which can be implemented independently from or in combination with the first aspect, a detection device as follows is provided.

The detection device is for detecting at least the occurrence and the location of occurrence of sensor element signals that are generated by sensor elements. The detection device includes a plurality of detector element circuits, each detector element circuit being configured to process an associated sensor element signal and to generate detector element signals, corresponding to the associated sensor element signal. Therein, each detector element circuit includes an impedance converter arranged to have as an input a sensor element current and to generate a detector element current corresponding to, in particular proportional to, the sensor element current, wherein the detector element current is one of the detector element signals.

In embodiments, each detector element circuit includes at least two impedance converters having as input the sensor element current, a first one of the impedance converters generating the element row output and a second one generating the element column output of the detector element circuit.

In embodiments, the detection device includes summation circuits, each summation circuit including an impedance converter arranged to have as an input a sum of currents, which if the summation circuit is a row summation circuit, is a sum of the corresponding element row outputs, or, if the summation circuit is a column summation circuit, is a sum of the corresponding element column outputs, and to generate at least one summation signal, corresponding to, in particular proportional to, the sum of currents.

The summation circuits can be row summation circuits and/or column summation circuits. Correspondingly, the summation signals can be first row summation signals, second row summation signals, first column summation signals, or second column summation signals.

In embodiments, each summation circuit includes at least two impedance converters having as input the same sum of currents, a first one of the impedance converters generating a first summation signal and a second one generating a second summation signal.

In embodiments, each of the at least two impedance converters includes a transistor in a common-base or common-gate configuration.

This means if, for example, the transistor is a NPN or PNP bipolar transistor, it is configured for an input current to flow through the transistor's emitter, and an output current to flow through the transistor's collector.

Or, if the transistor is a field effect transistor (PMOS or NMOS), it is configured for an input current to flow through the transistor's source, and an output current to flow through the transistor's drain If the impedance converter is part of one of the detector elements, then typically the input current is the sensor element current, and the output current is one of the element row output and element column output.

If the impedance converter is part of one of the summation circuits, then typically the input current is the sum of the element row outputs or of the element column outputs sensor element current, and the output current is one of the row summation and column summation signals.

In embodiments, the transistors of the at least two impedance converters are implemented by at least two transistors with a common base or gate.

In embodiments, the at least two impedance converters are implemented by a dual collector transistor or multi collector transistor.

Looking at the device as presented so far, but in a generalised fashion, it becomes evident that the row-wise and column-wise summation of element outputs and thresholding each sum is one way of determining two subsets of detector elements and associated sensor elements in which an event has occurred, and recording the address is one way of identifying the intersection of these subsets. With more generality, element outputs can be summed—alternatively or in addition to row-wise and column-wise—in other patterns: Further element outputs from arbitrary subsets of detector elements can be added, in corresponding further summation circuits, to generate corresponding further summation signals, which, when crossing corresponding thresholds, indicate that an event has occurred in one of the sensor elements corresponding to the respective subset of detector elements.

In embodiments, at least a subset of the detector element circuits is configured to generate at least one further element output, and the detection device is configured to determine at least one further summation signal corresponding to a sum of these further element outputs, and a subset detection signal indicating, by being in an active state, that the further summation signal crosses a threshold.

This further element output can be generated in addition to the element row output and the element column output, or instead of these. Thus, according to a further aspect of the invention, summation signals are not associated with rows or columns of sensor elements at all, but with other subsets of sensor elements.

Summation signals from such subsets of sensor elements and detector elements can be used to directly identify subsets of the sensor elements and thus subsets of the area of the detector in which an event has occurred (as row and column summation signals are). Furthermore, they can be used to identify the intersection of two such subsets or corresponding areas of the detector, as is done by means of the row and column address signals. Or these summation signals can be used as trigger signals that are activated only if an event occurs in the corresponding area.

In summary, the problem of the increasing number of parallel sensor capacitances is solved by providing for amplifying transistors in a common base configuration. This allows by duplicating (or multiplexing) their output signals as row and column signals for large number of sensors in a row or column without significant signal distortion, i.e., without limiting the bandwidth and thus most importantly preserving the timing single sensor timing information of the summed signal.

These duplicated (or multiplexed) signals are processed by being copied twice, one copy being used to in combination with a discriminator in order to digitally identify an address of the sensor element at which an event has occurred. The other copy is further added over all rows and over all columns, giving amplitude information and signal timing information.

As a result, the number of digital outputs of the detection device scales linearly with the size of the grid of sensor elements. The number of amplitude processing (thresholding, windowing or Analog-Digital-conversion) elements and timing digitisers (TDC) remains constant, independent of grid size.

The detection device works best if only one event at a time occurs, which generally is the case for detectors considered.

BRIEF DESCRIPTION OF THE DRAWINGS

The subject matter of the invention will be explained in more detail in the following text with reference to exemplary embodiments which are illustrated in the attached drawings, which schematically show:

FIG. 1 a structure of a detection device;
FIG. 2 a structure of a conceptual detector element;
FIG. 7 an alternative detail of the detection device.

DETAILED DESCRIPTION OF THE INVENTION

Figure 3:
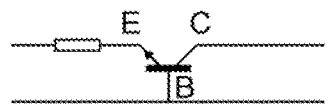
FIG. 3 a transistor in a common base (amplifier) configuration.

The reference symbols used in the drawings, and their meanings, are listed in summary form in the list of reference symbols. In principle, identical parts are provided with the same reference symbols in the figures.

FIG. 1 schematically shows the structure of a detection device 2 in combination with a grid of sensor elements 15. It shows a detector 1 with detector elements 10 including sensor elements 15 and detector element circuits 11 for generating detector element signals 13, 14 from sensor element signals 12;

intermediate circuits 21, 22, 31, 32, 41, 42, 51, 52 for deriving address signals 33, 34, timing signals 53 and trigger signals 54 from the detector element signals 13, 14; and a processing circuit 60 for converting and recording these signals.

FIG. 2 shows a single detector element 10, including a sensor element 15 generating a sensor element signal 12, and a detector element circuit 11 for processing the sensor element signal 12 and generating a element row output 13 and an element column output 14, collectively referred to as detector element signals. Typically, these detector element signals are essentially equal to one another, or have different amplitudes. Their shape can be essentially equal to that of the sensor element signal 12. More generally, the sensor element signal 12 and detector element signals 13, 14 can correspond to one another, in particular by being proportional to one another.

There is a one to one correspondence between sensor elements 15 and detector element circuits 11, so each sensor element 15 has an associated or corresponding detector element circuit 11 and vice versa.

The detector element circuit 11 is considered to be part of the detection device 2.

Typically, the sensor elements 15 are not considered to be part of the detection device 2. The detector elements 10, that is, the sensor elements 15 together with the associated detector element circuits 11 can be considered to constitute a detector 1. Usually, however, such a detector 1 is not a physical but rather a conceptual entity, if sensor elements 15 and detector element circuits 11 are implemented in different integrated circuits. If, in FIG. 1, the outline of the detection device 2 were considered to represent a physical boundary of the detection device 2, then each of the detector elements 10 would have a connection to the associated sensor element 15 located outside of the outline.

In embodiments, the sensor elements 15 and detector element circuits 11 are implemented as parts of a single integrated circuit. In general, all elements of the detection device (surrounded in FIG. 1 by the dashed line) or a subset of these elements can be implemented by a single integrated circuit.

Typically, the sensor elements 15 are arranged in a grid with N rows and M columns. The associated detector element circuits 11—which form part of an electronic circuit of the detection device 2—are not necessarily physically arranged in the same manner. However, conceptually they can be considered to be grouped in rows and columns, or more, precisely, in row subsets and column subsets of the set of all detector element circuits 11.

The detection device 2 can be implemented as an electronic circuit, with discrete elements, a (hybrid) mix of discrete and integrated circuit elements, or as a monolithic integrated circuit. Typically, the detector element circuits 11 and the intermediate circuits are implemented by discrete elements and/or custom made analogue circuits, and the processing circuit 60 is implemented by an application specific integrated circuit (ASIC). Alternatively, the functionality of the processing circuit 60 described below can be implemented by a plurality of separate discrete elements and/or custom made integrated circuits.

FIG. 3 shows a transistor in a common base (amplifier) configuration. In electronics, a common-base (also known as grounded-base) amplifier is one of three basic single-stage bipolar junction transistor (BJT) amplifier topologies, typically used as a current buffer or voltage amplifier. In this circuit the emitter terminal E of the transistor serves as the input, the collector C as the output, and the base B is connected to ground, or "common", hence its name. Instead of or in combination with the npn transistors shown in the figures, pnp transistors can be used. The analogous field-effect transistor circuit is the common-gate amplifier.

Figure 4:
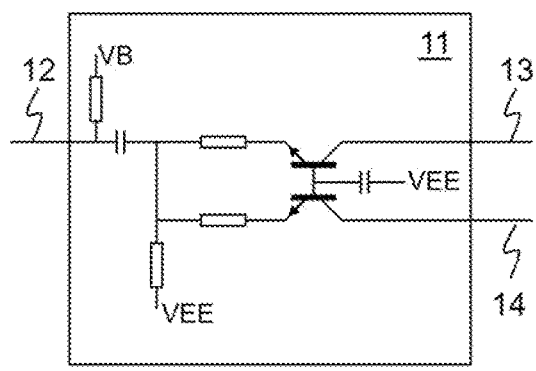
FIG. 4 a circuit with transistors sharing their base.
Figure 5:
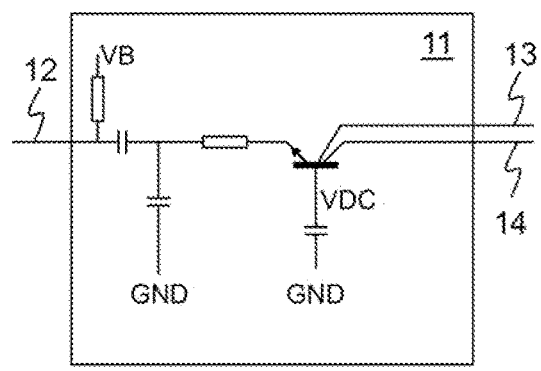
FIG. 5 a circuit with a dual collector transistor.

FIGS. 4 and 5 show possible implementations of detector element circuits 11. For the sake of clarity not all circuit elements that may be used for biasing the transistors and filtering the signals are shown.

In the embodiment of FIG. 4, two transistors are arranged each in a common base configuration, and the basis of the two transistors is shared. For example, the two transistors can be manufactured on the same substrate, with the basis being a contiguous area on the substrate.

A signal current corresponding to the sensor element signal 12 is split up and flows into the emitters of the two transistors, causing a corresponding, essentially equal current to flow in the element row output 13 and element column output 14. By sharing the basis, the two transistors can be manufactured to have essentially the same electrical properties and essentially the same temperature when in operation. For this reason the sensor element signal 12 is split into essentially equal parts flowing into the two transistors. As a result, the signals in the element row output 13 and element column output 14 also are essentially equal to each other.

Since each of the two transistors is operated in a common base configuration, it operates as an impedance converter. A capacitance of the sensor element 15 (for example, 100 pF) does therefore not affect the lines carrying the detector element signals 13, 14. Only an internal capacitance of the detector element circuit 11, which can be much smaller (for example, 2-5 pF) than the capacitance of the sensor element 15, affects the detector element signals 13, 14.

This reduced capacitance reduces the total capacitance that appears when combining several element row outputs 13 and several element column outputs 14 by the row and column summation circuits 21, 22 presented below. If signal lines from the sensor elements 15 themselves were combined, the total capacitance on these lines would distort and delay the corresponding signals too much.

In the embodiment of FIG. 5, a single transistor is arranged to have a dual collector, each collector terminal carrying one of the detector element signals. It is also connected and operated in a common base configuration. As in the preceding embodiment, the detector element signals 13, 14 carry currents having essentially the same value. For similar reasons, this is a consequence of the transistor being manufactured in an integrated manner, sharing their basis. Likewise, the circuit operating as an impedance converter and having a relatively small output capacitance leads to the same advantage of having a reduced total capacitance when combining several detector element signals.

The geometry of the collector of the transistor determines the relation between the currents in the two (or more) outputs. The sum of the two (or more) currents remains the same.

The embodiment of FIG. 5 can be adapted for more than two outputs, by adding one or more further collectors.

In other embodiments, two or more outputs can be generated by implementing an impedance converter as in FIG. 3 for each output.

Generally, with two or more outputs, the polarities of outputs can be inverted relative to one another.

The intermediate circuits 21, 22, 31, 32, 41, 42, 51, 52 are arranged to add and process the detector element signals 13, 14 in several stages.

For each row of sensor elements 15, and correspondingly, for each corresponding row subset of detector element circuits 11, a row summation circuit 21 is arranged to sum the signals, in particular currents, of the element row outputs 13 of this row. It generates, as outputs, a first row summation signal 23 and a second row summation signal 24 corresponding to this sum.

For each column of sensor elements 15, and correspondingly, for each corresponding column subset of detector element circuits 11, a column summation circuit 22 is arranged to sum the signals, in particular currents, of the element column outputs 14 of this column. It generates, as outputs, a first column summation signal 25 and a second column summation signal 26 corresponding to this sum.

An amplitude of theses row-wise or column-wise sums generally is proportional to an intensity of the event, or the sum of intensities of several events, occurring in the respective row or column.

Figure 6:
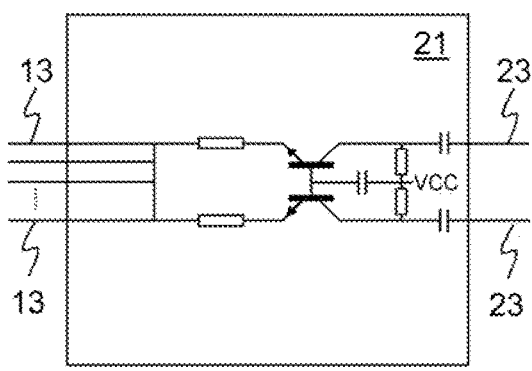
FIG. 6 a summation circuit.

FIG. 6 shows a possible implementation of a row summation circuit 21 or column summation circuit 22 (with the reference numbers referring to a row summation circuit 21 only). Therein, a plurality of detector element signals 13, 14, in this case element row outputs 13, are joined at the input side of the row summation circuit 21. The sum of their currents serves as the input to the row summation circuit 21. As in the detector element circuits 11, for generating a single output, there can be a single transistor in a common base configuration, and for generating two outputs, there can be two transistors with a shared base, as shown in FIG. 6. The basic function of the circuit is the same as in that of FIG. 4, except that in the row summation circuit 21 circuit there is more than one input, and thus the sum input currents corresponds to the two outputs.

For each of the row summation circuits 21, the first output or first row summation signal 23 is inputted to a corresponding row address discriminator 31. This row address discriminator 31 detects, when the first row summation signal 23 crosses a threshold, or when it is within a given range, the presence of an event in a sensor element 15 in the corresponding row, generating a binary row address signal 33.

For each of the column summation circuits 22, the first output or first column summation signal 25 is inputted to a corresponding column address discriminator 32. This column address discriminator 32 detects, when the first column summation signal 25 crosses a threshold, or when it is within a given range, the presence of an event in a sensor element 15 in the corresponding column, generating a binary column address signal 34.

The row address signal 33 and column address signal 34 are input to the processing circuit 60 for recording and storing.

For all of the row summation circuits 21, the second outputs or second row summation signals 24 are inputted into a row total circuit 41. The row total circuit 41 sums the signals, in particular currents of all the second row summation signals 24 and generates a row total signal 43.

For all of the column summation circuits 22, the second outputs or first column summation signals 25 are input to a column total circuit 42. The column total circuit 42 sums the signals, in particular currents of all the first column summation signal 25 and generates a column total signal 44.

The row total signal 43 and column total signal 44 both correspond to the total intensity of events in the entire grid of sensor elements 15. Ideally, they have the same amplitude, but variations in the implementation of the analogue circuits can cause them to differ.

As shown in FIG. 1, the row total signal 43 can be input to a timing circuit 51, and the column total signal 44 can be input to a trigger circuit 52. Alternatively, as shown in FIG. 7, the row total signal 43 and column total signal 44 can be added, and the sum input to the timing circuit 51 and trigger circuit 52.

In embodiments, the detector element 10 is configured with fast and slow elements in the detector element circuits 11 and/or in the row summation circuits 21 and column summation circuits 22. Generally, "fast" or "slow" propagation of signals can be influenced by the bandwidth of signal processing, amplitudes of currents representing signals, line capacitances, etc. Examples for fast and slow elements can be fast and slow outputs of dual (or multi) collector circuits, as described above. This can be combined with a configuration in which the row total signal 43 and column total signal 44 are kept separate and are inputted to the timing circuit 51 and trigger circuit 52 respectively. Then the fast elements and/or outputs are arranged in the path of signals leading to the trigger circuit 52, and the slow elements and/or outputs are arranged in the path of signals leading to the timing circuit 51. These signals can be also delayed on purpose, either by means of signal processing, like for instance in a constant fraction discriminator, or with a transmission line, such as a cable, of appropriate length. The time signal should be less distorted, in order to preserve timing information.

The trigger circuit 52 detects, when its input crosses a threshold, that an event has occurred, and generates a corresponding trigger signal 54. The trigger circuit 52 should operate as fast as possible, but with less regard to signal distortion.

If discriminators are used to find the amplitude, the discriminator outputs can be used as triggers. In embodiments, an Analog-Digital Converter (ADC) can be used to find the amplitude. For this, an extra trigger signal can be generated in the same way as two signals are generated for each sensor. Two copies of the row or column total signal 43, 44 can be made, and one can be used with a discriminator as a trigger for the ADC, and the other one as input to the ADC The trigger circuit 52 can be configured to generate the trigger signal 54 only if its input (the column total signal 44 or the sum of the column total signal 44 and row total signal 43) amplitude lies within a given range. This range corresponds to typical event intensities for single events. In this way, too small input values—corresponding to noise—and too large input values—corresponding to two or more events at the same time—can be eliminated and do not cause the trigger signal 54 to be generated.

The timing circuit 51 shapes, from the input signal, a corresponding timing signal 53 which represents a time at which the event occurred as faithfully as possible. The timing signal 53 will have a state transition, i.e. a rising or falling edge, which is slightly later than the state transition of the trigger signal 54.

Generally, existing methods for determining the time of an event represented by a change in a signal can be used— regardless of the physical or computational representation of the signal.

In the processing circuit 60, the trigger signal 54 is used to latch the row address signals 33 and column address signals 34 into corresponding address registers. The trigger signal 54 triggers a Time to Digital Converter (TDC) which determines an exact time at which the timing signal 53 changes its state. In case that an ADC is used for the amplitude determination the corresponding ADC output is also stored, with or without the help of the trigger signal.

As a result, the processing circuit 60 has stored in its memory the location of the event—defined by the content of the address registers—and the time, defined by the time determined by the TDC. In case an ADC is used, the signal amplitude is stored as well. This information can be stored for a series of events and processed online or offline at a later time.

In a PET imaging application, the information can be collected from two or more detectors 1, and used to generate a corresponding 3D representation of positron emission events.

In general, the summation circuits 21, 31, the row total circuits 41 and column total circuits 42, just as the detector element circuits 11, can
  be implemented with dual collector transistors instead of two transistors with a shared base;
  and can have more than two outputs, for example three or four.

The transistors in the various circuits described can be bipolar transistors implemented as NPN or PNP transistors, or with a combination of NPN and PNP transistors. The transistors in the various circuits described can be FET transistors implemented as nFET or pFET transistors, or with a combination of nFET and pFET transistors.

Generally, whenever a value is described as being given, it can be set by a user or automatically, and/or can be stored in computer memory or implemented as a characteristic of a circuit, e.g. a voltage value being determined by resistances in a voltage divider.

While the invention has been described in present embodiments, it is distinctly understood that the invention is not limited thereto, but may be otherwise variously embodied and practised within the scope of the claims.

The invention claimed is:

1. A detection device for detecting at least an occurrence and a location of the occurrence of sensor element signals that are generated by sensor elements, wherein:
the detection device comprises a plurality of detector element circuits, each detector element circuit being configured to process an associated sensor element signal and to generate detector element signals corresponding to the associated sensor element signal,
for each detector element circuit, the detector element signals comprise at least one element row output and at least one element column output, wherein values of these two outputs correspond to each other,
the detector element circuits are grouped into row subsets and column subsets,
wherein the union of all the row subsets is a set of detector element circuits, and each detector element circuit is a member of exactly one of the row subsets,
wherein the union of all the column subsets is a set of detector element circuits, and each detector element circuit is a member of exactly one of the column subsets, and
wherein every pairwise intersection of one of the row subsets with one of the column subsets contains exactly one detector element circuit,
the detection device is configured to determine,
for each row subset of the detector element circuits, at least a first row summation signal corresponding to a sum of the element row outputs of the detector element circuits of this row subset, and a row address signal indicating, by being in an active state, that the first row summation signal crosses a threshold,
for each column subset of detector element circuits, at least a first column summation signal corresponding to a sum of the element column outputs of the detector element circuits of this column subset, and a column address signal indicating, by being in an active state, that the first column summation signal crosses a threshold, and
for each row subset of detector element circuits, at least a second row summation signal corresponding to the aforementioned sum of the element row outputs of the detector element circuits of this row subset, and a row total signal corresponding to a sum of the second row summation signals over all row subsets.

2. The detection device of claim 1, being configured:
to determine, from the row total signal or from the column total signal or from a sum of the row total signal and column total signal, a timing signal and
to determine, from the timing signal, event time data representing a time derived from the timing signal.

3. The detection device of claim 2, wherein each detector element circuit comprises at least two impedance converters having as input the sensor element current, a first one of the impedance converters generating the element row output and a second one generating the element column output of the detector element circuit.

4. The detection device of claim 3, wherein each of the at least two impedance converters comprises a transistor in a common-base or common-gate configuration.

5. The detection device of claim 4, wherein the transistors of the at least two impedance converters are implemented by at least two transistors with a common base or gate.

6. The detection device of claim 4, wherein the at least two impedance converters are implemented by a dual collector transistor or multi collector transistor.

7. The detection device of claim 1, being configured:
to determine, from the row total signal or from the column total signal or from a sum of the row total signal and column total signal, a trigger signal, and
to trigger, by the trigger signal, a recording of at least one of
the state of row address signals and column address signals,
event time data representing a time at which a timing signal crosses a threshold.

8. The detection device of claim 1, comprising summation circuits, each summation circuit comprising an impedance converter arranged
to have as an input a sum of currents, which
if the summation circuit is a row summation circuit, is a sum of the corresponding element row outputs, or,
if the summation circuit is a column summation circuit, is a sum of the corresponding element column outputs, and
to generate at least one summation signal, corresponding to the sum of currents.

9. The detection device of claim 8, wherein each summation circuit comprises at least two impedance converters having as input the same sum of currents, a first one of the impedance converters generating a first summation signal and a second one generating a second summation signal.

10. The detection device of claim 8, wherein the at least one summation signal generated by the impedance converter is proportional to the sum of currents.

11. The detection device of claim 1, wherein at least a subset of the detector element circuits is configured to generate at least one further element output, and the detection device is configured to determine
at least one further summation signal corresponding to a sum of these further element outputs, and
a subset detection signal indicating, by being in an active state, that the further summation signal crosses a threshold.

12. The detection device of claim 1, wherein the values of the at least one element row output and of the at least one element column output are equal to one another.

13. A detection device for detecting at least an occurrence and a location of the occurrence of sensor element signals that are generated by sensor elements, wherein:
the detection device comprises a plurality of detector element circuits, each detector element circuit being configured to process an associated sensor element signal and to generate detector element signals corresponding to the associated sensor element signal,
for each detector element circuit, the detector element signals comprise at least one element row output and at least one element column output, wherein values of these two outputs correspond to each other,
the detector element circuits are grouped into row subsets and column subsets,
wherein the union of all the row subsets is a set of detector element circuits, and each detector element circuit is a member of exactly one of the row subsets,
wherein the union of all the column subsets is a set of detector element circuits, and each detector element circuit is a member of exactly one of the column subsets, and
wherein every pairwise intersection of one of the row subsets with one of the column subsets contains exactly one detector element circuit,
the detection device is configured to determine,
for each row subset of the detector element circuits, at least a first row summation signal corresponding to a sum of the element row outputs of the detector element circuits of this row subset, and a row address signal indicating, by being in an active state, that the first row summation signal crosses a threshold, for each column subset of detector element circuits, at least a first column summation signal corresponding to a sum of the element column outputs of the detector element circuits of this column subset, and a column address signal indicating, by being in an active state, that the first column summation signal crosses a threshold, and for each column subset of detector element circuits, at least a second column summation signal corresponding to the aforementioned sum of the element column outputs of the detector element circuits of this column subset, and a column total signal corresponding to a sum of the second column summation signals over all column subsets.

14. A detection device for detecting at least an occurrence and a location of the occurrence of sensor element signals that are generated by sensor elements, wherein:

the detection device comprises a plurality of detector element circuits, each detector element circuit being configured to process an associated sensor element signal and to generate detector element signals corresponding to the associated sensor element signal, for each detector element circuit, the detector element signals comprise at least one element row output and at least one element column output, wherein values of these two outputs correspond to each other, the detector element circuits are grouped into row subsets and column subsets, wherein the union of all the row subsets is a set of detector element circuits, and each detector element circuit is a member of exactly one of the row subsets, wherein the union of all the column subsets is a set of detector element circuits, and each detector element circuit is a member of exactly one of the column subsets, and wherein every pairwise intersection of one of the row subsets with one of the column subsets contains exactly one detector element circuit, the detection device is configured to determine, for each row subset of the detector element circuits, at least a first row summation signal corresponding to a sum of the element row outputs of the detector element circuits of this row subset, and a row address signal indicating, by being in an active state, that the first row summation signal crosses a threshold, for each column subset of detector element circuits, at least a first column summation signal corresponding to a sum of the element column outputs of the detector element circuits of this column subset, and a column address signal indicating, by being in an active state, that the first column summation signal crosses a threshold, each detector element circuit comprises an impedance converter arranged to have as an input a sensor element current and to generate a detector element current corresponding to the sensor element current, wherein the detector element current is one of the detector element signals.

15. The detection device of claim 14, wherein the detector element current is proportional to the sensor element current.

16. A method for detecting, by means of a detection device, at least an occurrence and a location of the occurrence of sensor element signals that are generated by sensor elements, wherein:

each of a plurality of detector element circuits of the detection device process an associated sensor element signal and generate detector element signals corresponding to the associated sensor element signal, for each detector element circuit, the detector element signals comprise at least one element row output and at least one element column output, wherein values of these two outputs correspond to each other, the detector element circuits are grouped into row subsets and column subsets, wherein the union of all the row subsets is a set of detector element circuits, and each detector element circuit is a member of exactly one of the row subsets, wherein the union of all the column subsets is a set of detector element circuits, and each detector element circuit is a member of exactly one of the column subsets, wherein every pairwise intersection of one of the column subsets with one of the column subsets contains exactly one detector element circuit, the detection device determines, for each row subset of the detector element circuits, at least a first row summation signal and a second row summation signal, both corresponding to a sum of the element row outputs of the detector element circuits of this row subset, a row address signal indicating, by being in an active state, that the first row summation signal crosses a threshold, and a row total signal corresponding to a sum of the second row summation signals over all row subsets, and for each column subset of the detector element circuits, at least a first column summation signal and a second column summation signal, both corresponding to a sum of the element column outputs of the detector element circuits of this column subset, a column address signal indicating, by being in an active state, that the first column summation signal crosses a threshold, and a column total signal corresponding to a sum of the second column summation signals over all column subsets, and the method comprises the steps of determining, from the row total signal or from the column total signal or from a sum of the row total signal and the column total signal, a timing signal, and determining from the timing signal, event time data representing a time derived from the timing signal.

17. The method of claim 16, wherein the event time data is a time when the timing signal crosses a threshold.

18. A method for detecting, by means of a detection device, at least an occurrence and a location of the occurrence of sensor element signals that are generated by sensor elements, wherein:

each of a plurality of detector element circuits of the detection device process an associated sensor element signal and generate detector element signals corresponding to the associated sensor element signal, for each detector element circuit, the detector element signals comprise at least one element row output and at least one element column output, wherein values of these two outputs correspond to each other, the detector element circuits are grouped into row subsets and column subsets, wherein the union of all the row subsets is a set of detector element circuits, and each detector element circuit is a member of exactly one of the row subsets, wherein the union of all the column subsets is a set of detector element circuits, and each detector element circuit is a member of exactly one of the column subsets, wherein every pairwise intersection of one of the column subsets with one of the column subsets contains exactly one detector element circuit, the detection device determines, for each row subset of the detector element circuits, at least a first row summation signal and a second row summation signal, both corresponding to a sum of the element row outputs of the detector element circuits of this row subset, a row address signal indicating, by being in an active state, that the first row summation signal crosses a threshold, and a row total signal corresponding to a sum of the second row summation signals over all row subsets, and for each column subset of the detector element circuits, at least a first column summation signal and a second column summation signal, both corresponding to a sum of the element column outputs of the detector element circuits of this column subset, a column address signal indicating, by being in an active state, that the first column summation signal crosses a threshold, and a column total signal corresponding to a sum of the second column summation signals over all column subsets, and the method comprises the steps of determining, from the row total signal or from the column total signal or from a sum of the row total signal and the column total signal, a trigger signal, and triggering, by the trigger signal, a recording of a state of row address signals and column address signals.

19. A method for detecting, by means of a detection device, at least an occurrence and a location of the occurrence of sensor element signals that are generated by sensor elements, wherein:

each of a plurality of detector element circuits of the detection device process an associated sensor element signal and generate detector element signals corresponding to the associated sensor element signal, for each detector element circuit, the detector element signals comprise at least one element row output and at least one element column output, wherein values of these two outputs correspond to each other, the detector element circuits are grouped into row subsets and column subsets, wherein the union of all the row subsets is a set of detector element circuits, and each detector element circuit is a member of exactly one of the row subsets, wherein the union of all the column subsets is a set of detector element circuits, and each detector element circuit is a member of exactly one of the column subsets, wherein every pairwise intersection of one of the column subsets with one of the column subsets contains exactly one detector element circuit, the detection device determines, for each row subset of the detector element circuits, at least a first row summation signal and a second row summation signal, both corresponding to a sum of the element row outputs of the detector element circuits of this row subset, a row address signal indicating, by being in an active state, that the first row summation signal crosses a threshold, and a row total signal corresponding to a sum of the second row summation signals over all row subsets, and for each column subset of the detector element circuits, at least a first column summation signal and a second column summation signal, both corresponding to a sum of the element column outputs of the detector element circuits of this column subset, a column address signal indicating, by being in an active state, that the first column summation signal crosses a threshold, and a column total signal corresponding to a sum of the second column summation signals over all column subsets, and the method comprises the steps of determining, from the row total signal or from the column total signal or from a sum of the row total signal and the column total signal, a timing signal, and determining from the timing signal, event time data representing a time derived from the timing signal, determining, from the row total signal or from the column total signal or from a sum of the row total signal and the column total signal, a trigger signal, and triggering, by the trigger signal, a recording of event time data representing a time at which a timing signal crosses a threshold.

* * * * *